United States Patent [19]

Isobe

[11] Patent Number: 5,677,239
[45] Date of Patent: Oct. 14, 1997

[54] METHOD FOR FABRICATING MULTI-LEVEL INTERCONNECTION STRUCTURE FOR SEMICONDUCTOR DEVICE

[75] Inventor: Akira Isobe, Tokyo, Japan

[73] Assignee: NEC Corporation, Tokyo, Japan

[21] Appl. No.: 164,579

[22] Filed: Dec. 10, 1993

[30] Foreign Application Priority Data

Dec. 15, 1992 [JP] Japan .................................. 4-353704

[51] Int. Cl.⁶ .................................................. H01L 21/44
[52] U.S. Cl. .................................. 437/195; 156/636.1
[58] Field of Search .................................. 437/195, 245, 437/228 POL, 235, 236, 238, 194; 156/656.1, 651.1, 652.1, 636.1

[56] References Cited

U.S. PATENT DOCUMENTS

| | | | |
|---|---|---|---|
| 4,511,429 | 4/1985 | Mizutani et al. | |
| 4,839,311 | 6/1989 | Riley et al. | 437/228 |
| 5,187,121 | 2/1993 | Cote et al. | 437/195 |
| 5,272,117 | 12/1993 | Roth et al. | 437/195 |
| 5,302,551 | 4/1994 | Iranmesh et al. | 437/195 |
| 5,306,665 | 4/1994 | Manabe | 437/189 |
| 5,382,545 | 1/1995 | Hong | 437/195 |

FOREIGN PATENT DOCUMENTS

| | | |
|---|---|---|
| 62-216344 | 9/1987 | Japan . |
| 63-207153 | 8/1988 | Japan . |

*Primary Examiner*—George Fourson
*Assistant Examiner*—C. Everhart
*Attorney, Agent, or Firm*—Sughrue, Mion, Zinn, Macpeak & Seas

[57] ABSTRACT

A method for fabricating a semiconductor device includes the steps of forming an interconnect metal film on an insulating layer and forming, on a surface of the interconnect metal film, a first insulating film formed of P—SiN. The first insulating film and the interconnect metal film are simultaneously patterned to form a lower interconnect. On the resulting surface, a second insulating film having a polishing rate higher than that of the first insulating film is formed. The entire surface of the second insulating film is flattened by a chemical mechanical polishing process using the first insulating film as a stopper. Then, on the resulting surface, a third insulating film is formed. According to one embodiment, the first insulating film used as the stopper remains on the lower interconnect but not between adjacent interconnects and, according to another embodiment, such film is completely removed by etching. Thus, an increase in the capacitance between the interconnects is prevented and any stress migration therein is suppressed.

18 Claims, 4 Drawing Sheets

METHOD FOR FABRICATING MULTI-LEVEL INTERCONNECTION STRUCTURE FOR SEMICONDUCTOR DEVICE

BACKGROUND OF THE INVENTION (1) Field of the Invention

The present invention relates to a method for fabricating a semiconductor device, and more particularly to a method for fabricating a semiconductor device in which an interlayer insulating film in a multi-level interconnection structure is flattened or planarized.

(2) Description of the Related Art

With an increased need for highly dense multi-level interconnections in a semiconductor device, there is a stronger requirement for an interlayer insulating film formed between metal interconnect layers to be perfectly flat and planar. In an attempt to meet such requirement, there has been proposed a method whereby a surface of the interlayer insulating film is polished by a Chemical Mechanical Polishing process (hereinafter referred to as "CMP process") which is a mechanical polishing process using a chemical agent. FIGS. 1A through 1D are for showing an example of such process. FIG. 1A shows a state in which, after an aluminum interconnect layer 13 is formed in a predetermined pattern as a lower interconnect layer on a surface of an insulating film 12 on a semiconductor substrate 11, a plasma silicon oxide film (hereinafter referred to as "P—SiO film") 14 is formed as an interlayer insulating film. Then, the P—SiO film 14 is subjected to polishing of the CMP process and its surface is made flat as shown in FIG. 1B. Thereafter, though not shown in the drawings, an aluminum interconnect layer is formed as an upper interconnect layer and this completes the fabrication of a multi-level interconnect structure.

In a surface planarization technique using the CMP process, it is necessary that the polishing or lapping of the P—SiO film 14 be stopped at an exact timing when it has reached a certain predetermined thickness. However, it is difficult to know and determine the exact timing for stopping the polishing. If the amount of the polishing is excessive, the lower aluminum film 13 may be polished thereby reducing the thickness thereof as seen in FIG. 1C. On the contrary, if the amount of the polishing falls short, the P—SiO film 14 becomes too thick, as seen in FIG. 1D, in which case a step or uneven surface topography is not satisfactorily removed with a result that the surface planarization is insufficient.

In the conventional method described above, it has been the practice to determine the amount of polishing from the time converted and calculated from the polishing rate of the insulating film concerned. This involves a problem in that no appropriate polishing can be achieved when there is a change in the polishing rate itself.

As a way to solve the above problem, there has been proposed a surface planarization technique which utilizes an insulating film having a low polishing rate. That is, as shown in FIG. 2A, after an aluminum interconnect layer 23 is formed in a predetermined pattern as a lower interconnect on a surface of an insulating film 22 on a semiconductor substrate 21, a plasma silicon nitride film (hereinafter referred to as "P—SiN film") 24 as an interlayer insulating film having a low polishing rate is deposited to a thickness of about 0.3 μm by a Plasma-assisted Chemical Vapor Deposition (PCVD) on the overall surface of the device. Then, the P—SiO film 25 is deposited to a thickness of about 1.5 μm on the P—SiN film 24 by the PCVD process.

Thereafter, as shown in FIG. 2B, the overall surface of the resulting films is polished. The polishing rate of the P—SiN film 24 then is about ⅕ that of the P—SiO film 25 so that, when the polishing reaches a point where the P—SiN film 24 exposes its portion having a step therein, the overall polishing rate is lowered. For this reason, even when there is a slight error in the polishing time, it is possible to avoid the exposure and polishing of the aluminum interconnect layer 23 caused by the extended polishing time.

As shown in FIG. 2C, on the entire surface planarized as described above, a P—SiO film 26 is deposited to a thickness of about 0.8 μm to form an interlayer insulating film. Then, as shown in FIG. 2D, this interlayer insulating film 26 is provided with a through-hole and an upper aluminum pattern 27 is formed thereat, and this completes the multi-level interconnect structure.

In the above described surface planarization technique, the P—SiN film 24 is utilized as a stopper when the P—SiO film 25 is polished by the CMP process. The use of the P—SiN film as a stopper in this way has been disclosed, for example, in Japanese Patent Application Kokai Publication No. Sho 62-216344 and Kokai Publication No. Sho 63-207153. However, the examples disclosed in these publications relate to the use of the P—SiN film as a stopper when a metal is polished.

Thus, conventionally, for making the interlayer insulating film flat, the P—SiN film has been used as a stopper in the CMP process. However, since the P—SiN film is formed in the entire surface area that includes the aluminum interconnects, the P—SiN film remains between adjacent interconnects after the completion of the multi-level interconnect structure. The dielectric constant of the P—SiN film is as large as about 8 so that line capacitance between the interconnects in the completed interconnect structure becomes large accordingly, and this possibly results in the deterioration of operation characteristics, that is, the slowing of operation speeds in a semiconductor device.

Also, since the stress in the P—SiN film is large, the aluminum interconnects receive stresses in the course of, for example, a subsequent thermal process or accelerated test, and this leads to a problem of the so-called "stress migration" in which a void or a break is caused to occur in the aluminum interconnects.

SUMMARY OF THE INVENTION

It is, therefore, an object of the present invention to overcome the problems existing in the prior art and to provide an improved method for fabricating a semiconductor device in which an interlayer insulating film is planarized and which is constituted by a highly reliable multi-level interconnect structure.

It is another object of the invention to provide a method for fabricating a multi-level interconnect structure which is capable of suppressing an increase in the capacitance between interconnects and also an occurrence of stress migration therein.

According to one aspect of the invention, there is provided a method for fabricating a semiconductor device having a multi-level interconnection structure, the method comprising the steps of:

forming an insulating layer on a semiconductor substrate;

forming an interconnect metal film on the insulating layer;

forming, on an entire surface of the interconnect metal film, a first insulating film having a low polishing rate in a chemical mechanical polishing process;

sequentially and selectively etching the first insulating film and the interconnect metal film to form a lower interconnect;

forming, on an entire resulting surface, a second insulating film having a polishing rate higher than that of the first insulating film, so that the lower interconnect and the first insulating film which remains on the lower interconnect are completely buried in the second insulating film;

lapping down a surface of the second insulating film by the chemical mechanical polishing process using the first insulating film as a stopper thereby forming a planarized surface of the first and second insulating films; and forming a third insulating film on the planarized surface of the first and second insulating films.

According to another aspect of the invention, the above method for fabricating the semiconductor device may further comprise a step for etching a surface of the first insulating film and a surface of the second insulating film under a condition of etching rates common to both the surfaces, so that the first insulating film on the lower interconnect is removed.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 8A through 3E are diagrammatic sectional views for explaining the process steps in a method for fabricating a semiconductor device according to a first embodiment of the present invention.

PREFERRED EMBODIMENTS OF THE INVENTION

Now, preferred embodiments of the invention are explained with reference to the accompanying drawings.

Figure 1A:
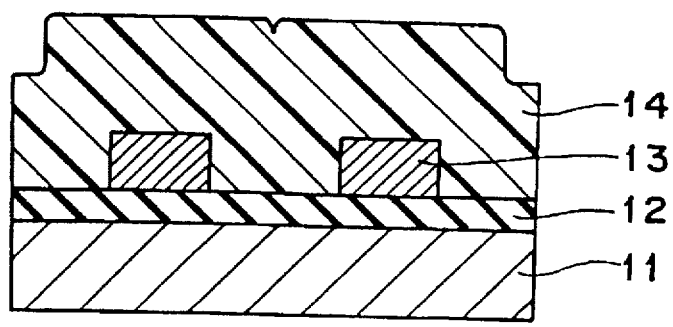
FIGS. 1A through 1D are diagrammatic sectional views for explaining the process steps in a conventional method for fabricating a semiconductor device using a CMP process.
Figure 1B:
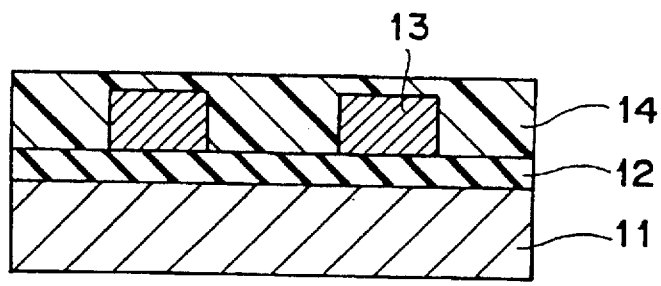
Figure 1C:
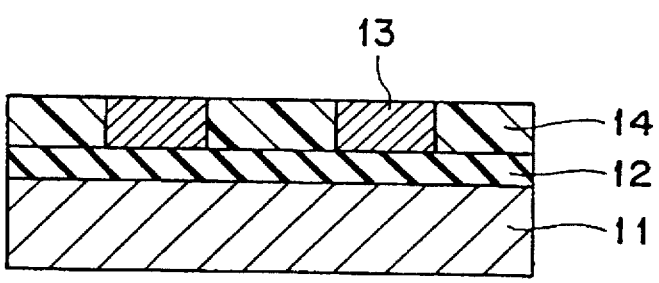
Figure 1D:
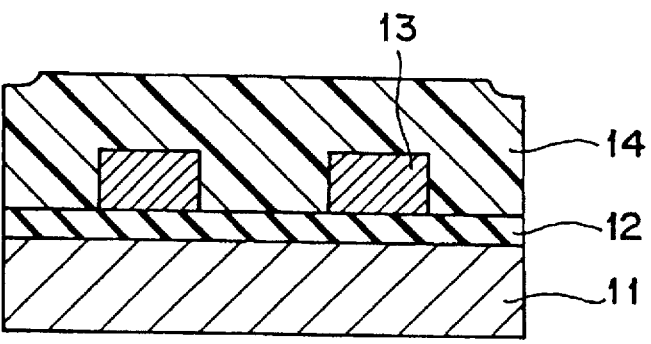
Figure 2A:
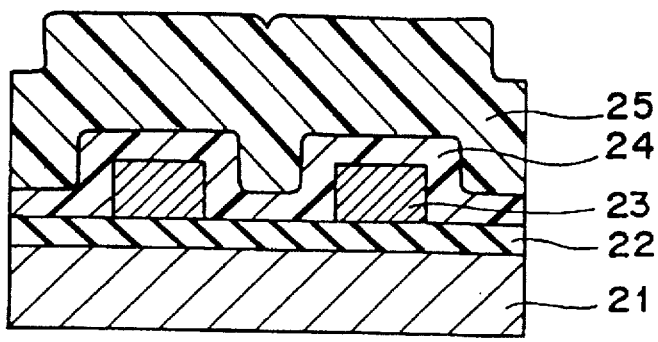
FIGS. 2A through 2D are diagrammatic sectional views for explaining the process steps in another conventional method for fabricating a semiconductor device using a CMP process.
Figure 2B:
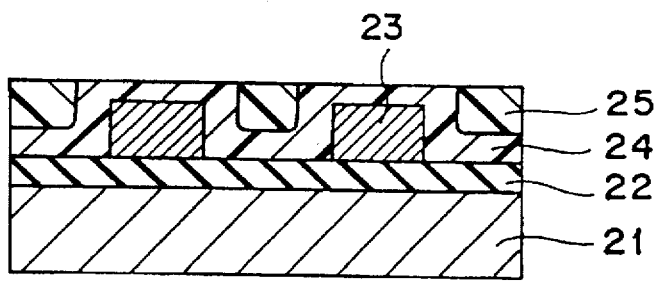
Figure 2C:
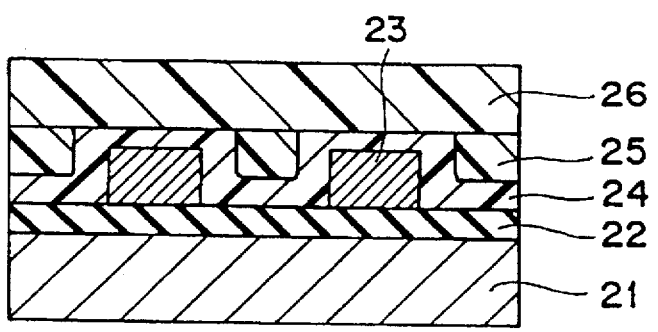
Figure 2D:
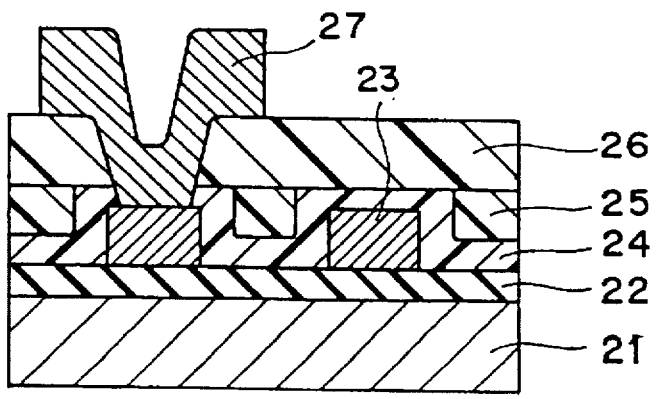
Figure 3A:
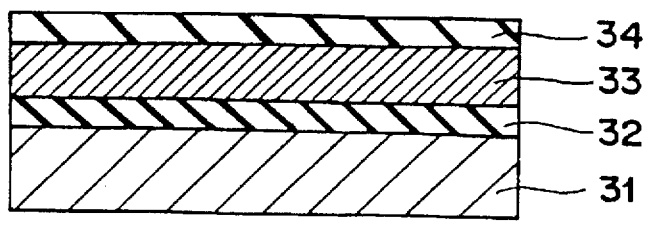
Figure 3B:
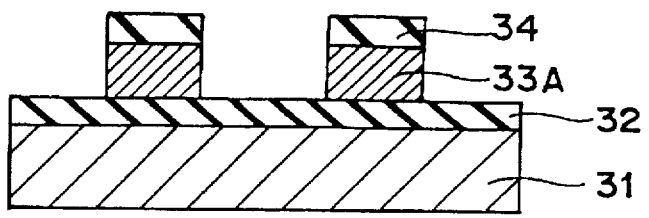

FIGS. 3A through 3E show, in diagrammatic sectional views, a structure of a first embodiment according to the invention for explaining the process steps for fabricating the multi-level interconnection structure. As seen in FIG. 3A, an aluminum silicon copper alloy (Al/Si/Cu alloy) film 33 is deposited to a thickness of about 0.5 µm as a lower interconnect by a sputtering method on an insulating film 32 located on a surface of a semiconductor substrate 31. The lower interconnect may be formed by the CVD method in place of the sputtering method. Then, on the entire surface of the aluminum silicon copper alloy film 33, a P—SiN film 34 is deposited to a thickness of about 0.3 µm by, for example, the PCVD process. Thereafter, on the P—SiN film 34, a photoresist film (not shown) is applied and is developed into a pattern and, with this pattern used as a mask, the P—SiN film 84 and the lower interconnect layer 33 are sequentially and selectively etched by such a method as a selective ion-etching, whereby a lower interconnect 33A is formed in a desired pattern as shown in FIG. 3B.

Figure 3C:
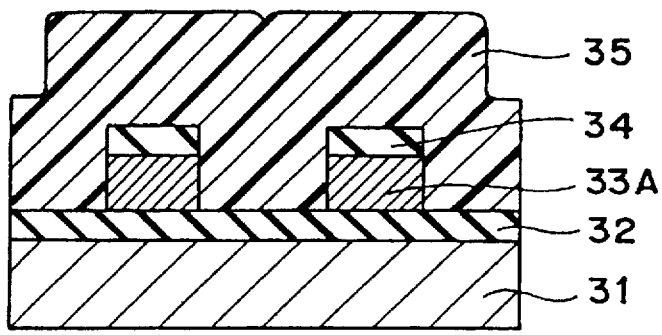
Figure 3D:
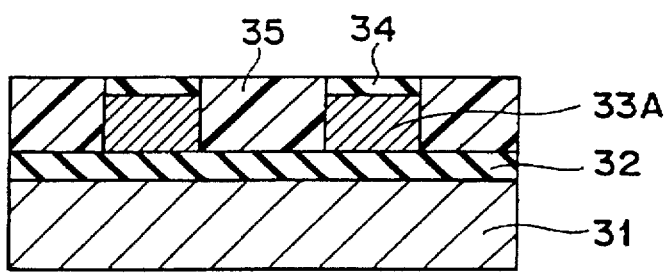

Next, as shown in FIG. 3C, on the entire resultant surface, a P—SiO film 35 is grown to a thickness of 1.5 µm as an interlayer insulating film by, for example, the PCVD process, whereby the lower interconnect 33A and the P—SiN film 34 are completely buried therein. Then, by employing the CMP process, the P—SiO film 35 is polished until this film reaches a predetermined thickness. By this polishing, a surface of the P—SiO film 35 is made flat as seen in FIG. 3D. In this CMP polishing process, the polishing rate of the P—SiN film 34 is about ⅕ that of the P—SiO film 35 as already explained so that, when the polishing of the P—SiO film 35 progresses to a state wherein the P—SiN film 34 exposes itself, the P—SiN film 34 acts as a polishing stopper and the polishing rate is then reduced to ⅕ of the polishing rate theretofore.

For the above reason, in the polishing process to continue, even if a slight error is made in the polishing time, there will be no occurrence of a great error in the thicknesses of the P—SiN film 34 and the P—SiO film 35. That is, even when the polishing time is set somewhat longer, there will be no likelihood that the P—SiN film 34 is polished to such an extent that a surface of the lower interconnect 33A is also polished.

In this example, the desired polishing time is calculated based on the polishing rate obtained in advance and, by having the polishing progress controlled under such polishing time, the P—SiN film 34 is allowed to remain to a thickness of about 0.2 µm.

Figure 3E:
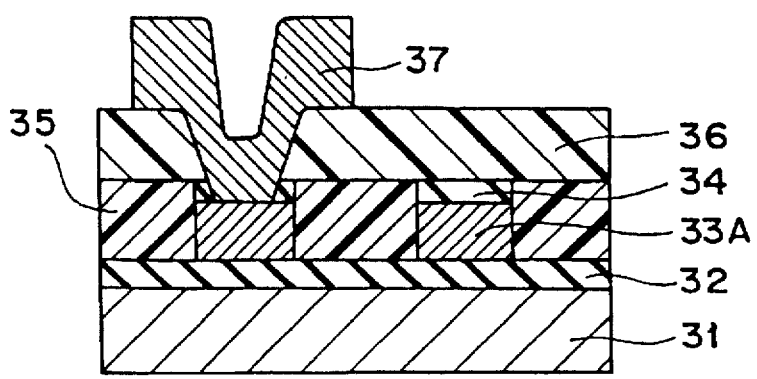

Thereafter, as seen in FIG. 3E, a P—SiO film 36 is deposited to a thickness in the order of 0.6 µm on the entire surface to form an interlayer insulating film. Needless to say that a surface of the interlayer insulating film 36 becomes flat because the surface the P—SiO film 35 is coplanar with the surface of the P—SiN film 34 by the CMP polishing. A through-hole is opened in the interlayer insulating film 36 and the P—SiN film 34, and an upper interconnect layer 37 of, for example, aluminum alloy is formed. This completes the formation of the multi-level interconnect structure.

Since the multi-level interconnect structure according to this embodiment utilizes the P—SiN film 34 as a stopper in the CMP polishing process, there is no possibility for the lower interconnect 33A to be polished or the uneven surface topograph of the interlayer insulating film 35 to remain even when the polishing time is less strictly controlled and, thus, it is possible to accomplish the planarization of the surface as desired. The P—SiN film 34 used as the stopper is allowed to remain on the lower interconnect 33A but does not remain between adjacent interconnects, that is, at the side-wall portion of the lower interconnect 33A. Thus, even when the dielectric constant of the P—SiN film 34 is larger than that of, for example, a P—SiO film 35, there will be no significant increase in the capacitance between the adjacent interconnects and hence no deterioration in operation speeds in the fabricated semiconductor device. Also, since there is little influence from the stress in the P—SiN film 34, the occurrence of any stress migration can be suppressed.

Figure 4A:
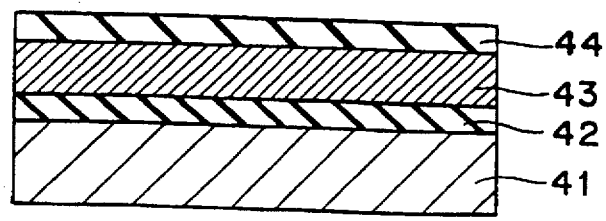
FIGS. 4A through 4E are diagrammatic sectional views for explaining the process steps in a method for fabricating a semiconductor device according to a second embodiment of the present invention.
Figure 4B:
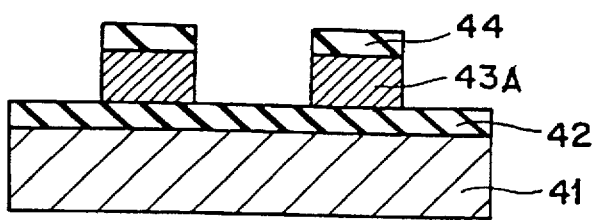

FIGS. 4A through 4E are diagrammatic sectional views for explaining the process steps for fabricating a structure of a second embodiment according to the invention. As shown in FIG. 4A, an aluminum silicon copper alloy (Al/Si/Cu alloy) film 43 is deposited to a thickness of about 0.5 µm as a lower interconnect by the sputtering method or the CVD method on an insulating film 42 located on a surface of a semiconductor substrate 41. Then, on the entire surface of the aluminum silicon copper alloy film 43, a P—SiN film 43 is deposited to a thickness of about 0.3 µm by the PCVD process. Thereafter, by a photolithographic technique, the P—SiN film 44 and the lower interconnect film 43 are sequentially and selectively etched by such a method as a selective ion-etching, whereby a lower interconnect 43A is formed in a desired pattern as shown in FIG. 4B.

Figure 4C:
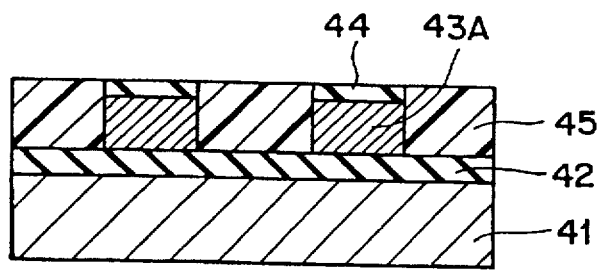

Next, on the entire surface, a P—SiO film 45 is grown to a thickness of 1.5 µm as an interlayer insulating film whereby the lower interconnect 43A and the P—SiN film 44 are completely buried therein. Then, by employing the CMP process, the P—SiO film 45 is polished until this film reaches a predetermined thickness. By this polishing, a surface of the P—SiO film 45 is made flat as seen in FIG. 4C. In this CMP polishing process, the polishing rate of the P—SiN film 44 is about ⅕ that of the P—SiO film 45 so that, by using the P—SiN film 44 as a polishing stopper and controlling the polishing based on the polishing time obtained in advance from the polishing rate, the P—SiN film 44 is left behind to a thickness of about 0.2 µm.

The process steps up to this point are the same as those in the method according to the first embodiment explained above.

Figure 4D:
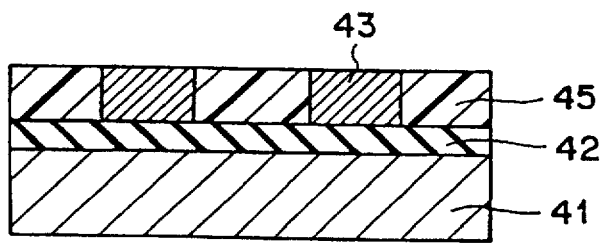

Next, by employing a parallel-plate reactive-ion etching (RIE) system using, for example, $CF_4$ as an etching gas, the entire surface is etched until the P—SiN film 44 completely disappears. By appropriately setting the conditions such as the concentration and the flow rate of the etching gas and also the pressure in the system, the etching rate of the P—SiN 44 and that of the P—SiO 45 can be made substantially the same and, in this way, the P—SiN film 44 and the P—SiO film 45 as the interlayer insulating films are caused to be etched uniformly without leaving any undesirable topography or a step on the surfaces of those films. As a result, the P—SiN film 44 on the lower interconnect 43A is completely removed as seen in FIG. 4D. Needless to say that, even though the surface of the lower interconnect 43A made from aluminum alloy is then exposed, the same is not etched.

Figure 4E:
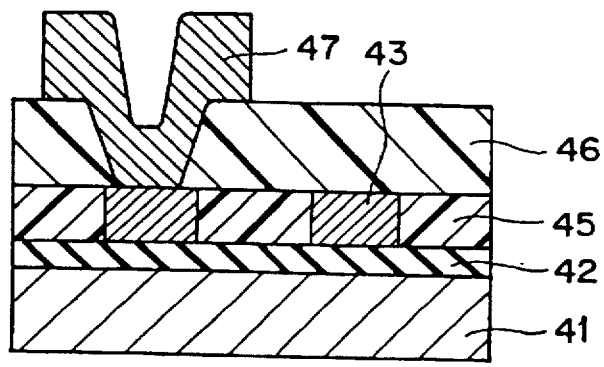

Thereafter, as seen in FIG. 4E, a P—SiO film 46 is deposited by, for example, the PCVD process, to a thickness in the order of 0.8 µm on the entire surface to complete the interlayer insulating film. The surface of the interlayer insulating film 46 becomes flat because the surfaces of the underlying P—SiO film 45 have been flattened by the CMP polishing process and the RIE etching. A through-hole is opened in the interlayer insulating film 46 and an upper interconnect 47 of, for example, aluminum alloy is formed. This completes the formation of the multi-level interconnect structure.

In the multi-level structure thus formed according to this second embodiment of the invention, the P—SiN 44 used as the stopper in the CMP polishing process does not remain at all in the structure, which means that any increase in the capacitance between the adjacent interconnects or any occurrence of stress migration that may be due to the dielectric constant of the P—SiN 44 can be completely and reliably prevented.

As explained above, according to the first embodiment of the invention, the interconnect metal film and the first insulating film used as a stopper in the CMP polishing process are simultaneously patterned to form the lower interconnect. Then, the interlayer insulating film as the second insulating film is formed and this film is polished and planarized by the CMP process. The first insulating film constituted by, for example, a P—SiN film, does not remain between adjacent interconnects. The advantages achieved thereby include the prevention of an increase in the capacitance between the adjacent interconnects and the enhancement of the reliability of the semiconductor device by suppressing the lowering of operation speeds in the semiconductor device and the occurrence of stress migration in the interconnects.

Also, according to the second embodiment of the invention, since the first insulating film used as the stopper in the CMP process is completely removed by etching, the first insulating film constituted by, for example, P—SiN does not remain at all in the multi-level interconnect structure. This results in a further improvement against the lowering of operation speeds in the semiconductor device and the occurrence of stress migration in the interconnects.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device having a multi-level interconnection structure, said method comprising the steps of:

forming an insulating layer on a semiconductor substrate;

forming an interconnect metal film on said insulating layer;

forming, on an entire surface of said interconnect metal film, a first insulating film having a first polishing rate in a chemical mechanical polishing process;

sequentially and selectively etching said first insulating film and said interconnect metal film to form a lower interconnect;

forming, on an entire resulting surface, a second insulating film having a second polishing rate higher than said first polishing rate of said first insulating film, so that said lower interconnect and said first insulating film which remains on said lower interconnect are completely buried in said second insulating film;

lapping down a surface of said second insulating film by the chemical mechanical polishing process using said first insulating film as a stopper thereby forming a planarized surface of said first and second insulating films;

planarizing said lower interconnect and said second insulating film; and forming a third insulating film on said planarized surface of said first and second insulating films.

2. A method for fabricating a semiconductor device according to claim 1, in which said interconnect metal film is formed by a sputtering method.

3. A method for fabricating a semiconductor device according to claim 1, in which each of said first, second and third insulating films is formed by a plasma-assisted chemical vapor deposition method.

4. A method for fabricating a semiconductor device according to claim 1, in which said lower interconnect is formed by a selective ion-etching method.

5. A method for fabricating a semiconductor device according to claim 1, in which said second insulating film is formed of a plasma silicon oxide (P—SiO) film.

6. A method for fabricating a semiconductor device according to claim 1, in which said first insulating film is deposited to a thickness of about 0.3 µm on said interconnect metal film.

7. A method for fabricating a semiconductor device according to claim 1, in which said first insulating film is formed of a plasma silicon nitride (P—SiN) film.

8. A method for fabricating a semiconductor device according to claim 1, in which said second insulating film is deposited to a thickness of about 1.5 μm.

9. A method for fabricating a semiconductor device having a multi-level interconnection structure, said method comprising the steps of:

forming an insulating layer on a semiconductor substrate;

forming an interconnect metal film on said insulating layer;

forming, on an entire surface of said interconnect metal film, a first insulating film having a first polishing rate in a chemical mechanical polishing process;

sequentially and selectively etching said first insulating film and said interconnect metal film to form a lower interconnect;

forming, on an entire resulting surface, a second insulating film having a second polishing rate higher than said first polishing rate of said first insulating film, so that said lower interconnect and said first insulating film which remains on said lower interconnect are completely buried in said second insulating film;

lapping down a surface of said second insulating film by the chemical mechanical polishing process using said first insulating film as a stopper thereby forming a planarized surface of said first and second insulating films;

etching a surface of said first insulating film and a surface of said second insulating film under a condition of etching rates common to both said surfaces so that said first insulating film on said lower interconnect is removed to thereby form a planarized surface of said second insulating film and said lower interconnect; and forming a third insulating film on said planarized surface of said second insulating film and said lower interconnect.

10. A method for fabricating a semiconductor device according to claim 9, in which said first insulating film is removed completely by employing a parallel-plate reactive-ion etching (RIE) system using $CF_4$ as an etching gas.

11. A method for fabricating a semiconductor device according to claim 10, in which a concentration and a flow rate of said etching gas and a pressure in said parallel-plate reactive-ion etching (RIE) system are controlled so that an etching rate of said first insulating film becomes substantially the same as that of said second insulating film.

12. A method for fabricating a semiconductor device according to claim 9, in which said interconnect metal film is formed by a sputtering method.

13. A method for fabricating a semiconductor device according to claim 9, in which each of said first, second and third insulating films is formed by a plasma-assisted chemical vapor deposition method.

14. A method for fabricating a semiconductor device according to claim 9, in which said lower interconnect is formed by a selective ion-etching method.

15. A method for fabricating a semiconductor device according to claim 9, in which said first insulating film is formed of a plasma silicon oxide (P—SiO) film.

16. A method for fabricating a semiconductor device according to claim 9, in which said first insulating film is deposited to a thickness of about 0.3 μm on said interconnect metal film.

17. A method for fabricating a semiconductor device according to claim 9, in which said first insulating film is formed of a plasma silicon nitride (P—SiN) film.

18. A method for fabricating a semiconductor device according to claim 9, in which said second insulating film is deposited to a thickness of about 1.5 μm.

* * * * *